United States Patent
Park et al.

(10) Patent No.: US 11,497,123 B2
(45) Date of Patent: Nov. 8, 2022

(54) DISPLAY DEVICE

(71) Applicant: SAMSUNG DISPLAY CO., LTD., Yongin-si (KR)

(72) Inventors: Han Ho Park, Yongin-si (KR); Jeong Eun Park, Goyang-si (KR); Joong Mok Lee, Suwon-si (KR); Chung-Seok Lee, Hwaseong-si (KR); So Yeon Joo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 10 days.

(21) Appl. No.: 17/233,871

(22) Filed: Apr. 19, 2021

(65) Prior Publication Data
US 2022/0087026 A1 Mar. 17, 2022

(30) Foreign Application Priority Data
Sep. 11, 2020 (KR) ........................ 10-2020-0117033

(51) Int. Cl.
*H05K 1/18* (2006.01)
(52) U.S. Cl.
CPC ... *H05K 1/189* (2013.01); *H05K 2201/10128* (2013.01)
(58) Field of Classification Search
CPC . H05K 2201/10128; H05K 1/18; H05K 1/189
USPC .......................................................... 361/749
See application file for complete search history.

(56) References Cited

U.S. PATENT DOCUMENTS

| | | | |
|---|---|---|---|
| 2007/0216846 A1* | 9/2007 | Tseng | G02F 1/13452 349/149 |
| 2017/0196080 A1* | 7/2017 | Meng | H05K 1/14 |
| 2017/0261542 A1 | 9/2017 | Onishi | |
| 2019/0392741 A1* | 12/2019 | Cho | G09G 3/3225 |

FOREIGN PATENT DOCUMENTS

| | | |
|---|---|---|
| JP | 2003-690856 | 3/2003 |
| JP | 2006-350064 | 12/2006 |
| JP | 2012-226058 | 11/2012 |
| KR | 10-2061005 | 1/2020 |

* cited by examiner

*Primary Examiner* — Tremesha S Willis
(74) *Attorney, Agent, or Firm* — F. Chau & Associates, LLC

(57) ABSTRACT

A display device includes a display panel, a printed circuit board (PCB), and a flexible printed circuit board (FPCB). The display panel includes a first pad portion. The PCB includes a second pad portion. The FPCB includes a first end portion and a second end portion. The first end portion is connected to the first pad portion, and the second end portion is connected to the second pad portion. The second pad portion includes a first pad group and a second pad group, each including a plurality of test pads. One test pad of the first pad group is connected to one test pad of the second pad group.

20 Claims, 13 Drawing Sheets

DISPLAY DEVICE

CROSS-REFERENCE TO RELATED APPLICATION

This application claims priority to and the benefit of Korean Patent Application No. 10-2020-0117033, filed in the Korean Intellectual Property Office on Sep. 11, 2020, the entire contents of which are herein incorporated by reference.

BACKGROUND

1. Technical Field

One or more embodiments described here in relate to a display device.

2. Description of the Related Art

A flexible printed circuit board (FPCB) may include a flexible insulated substrate equipped with wiring for connection to one or more circuits or electronic components. When used in a display device, the FPCB may be used to connect a display panel and a printed circuit board (PCB). If the FPCB is bonded to the display panel, pads of the display panel may be electrically connected to pads of the FPCB. As the size of the pads become smaller and the pitch of the pads becomes finer to achieve higher resolution displays, the bonding quality of the electrical connections of the FPCB may degrade.

The above information disclosed in this Background section is only for enhancement of understanding of the background, and therefore it may contain information that does not form the prior art that is already known in this country to a person of ordinary skill in the art.

SUMMARY

One or more embodiments provide a display device with an improved arrangement of connection pads at least relative to at least one printed circuit board, which, for example, may include but is not limited to a flexible printed circuit board.

These or other embodiments provide a display device having at least one printed circuit board that has a reduced number of electrical connections, which board, for example, may include but is not limited to a flexible printed circuit board.

These or other embodiments provide a display device that achieves improved bonding quality of electrical connections with a printed circuit board, which, for example, may include but is not limited to a flexible printed circuit board.

These or other embodiments provide an arrangement of connection pads in a display device which allows for efficient testing of the bonding quality of a flexible printed circuit board in a short period of time, which flexible printed circuit board may connect, for example, a printed circuit board to a display panel.

In accordance with one or more embodiments, a display device includes a display panel including a first pad portion, a printed circuit board (PCB) including a second pad portion, and a flexible printed circuit board (FPCB) including a first end portion and a second end portion, the first end portion connected to the first pad portion and the second end portion connected to the second pad portion. The second pad portion includes a first pad group and a second pad group, each including a plurality of test pads. One test pad of the first pad group is connected to one test pad of the second pad group.

In accordance with one or more embodiments, a display device includes a display panel including a first pad portion and a second pad portion, a printed circuit board (PCB) including a third pad portion and a fourth pad portion, a first flexible printed circuit board (FPCB) including a first end portion connected to the first pad portion and a second end portion connected to the third pad portion, and a second flexible printed circuit board including a first end portion connected to the second pad portion and a second end portion connected to the fourth pad portion. The third pad portion includes a first pad group and a second pad group each including a plurality of test pads, and the fourth pad portion includes a first pad group and a second pad group each including a plurality of test pads. One test pad of the second pad group of the third pad portion is connected to one test pad of the first pad group of the fourth pad portion.

DETAILED DESCRIPTION OF THE EMBODIMENTS

Figure 1:
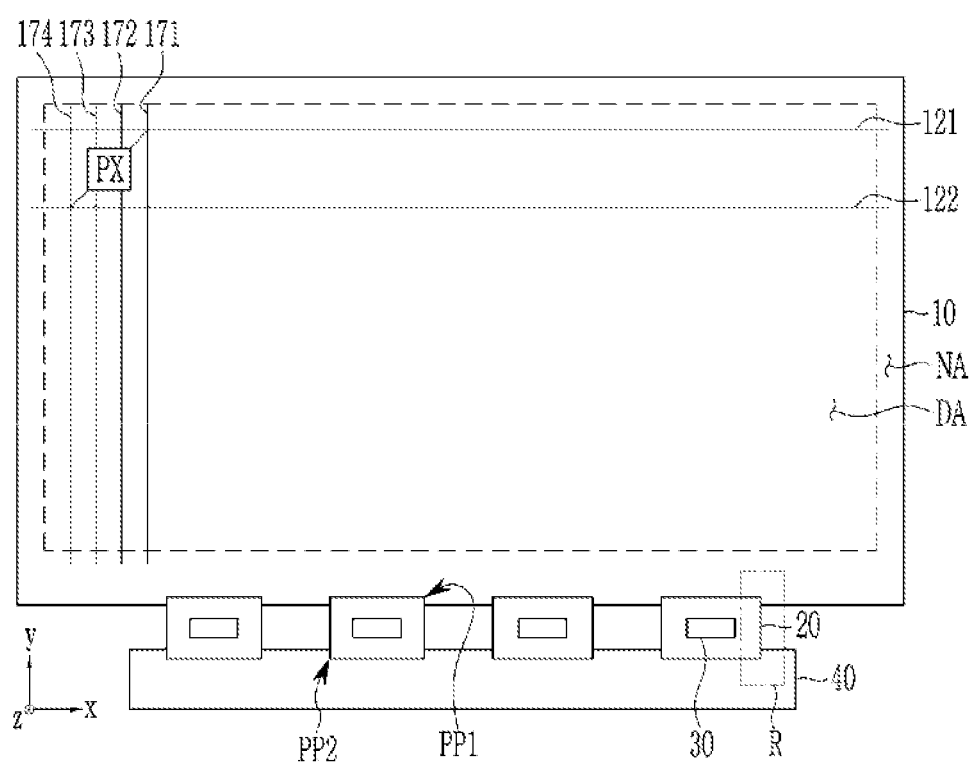
FIG. 1 illustrates an embodiment of a display device.

Embodiments will be described in detail with reference to accompanying drawings so that those skilled in the art to which the inventive concept belongs can easily implement them. Further, sizes and thicknesses of constituent members shown in the accompanying drawings are arbitrarily given for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, unless explicitly described to the contrary, the word "comprise" and variations such as "comprises" or "comprising" will be understood to imply the inclusion of stated elements but not the exclusion of any other elements.

Throughout the specification, "connected" does not only mean that two or more constituent elements are directly connected, but also when two or more constituent elements are connected indirectly through other constituent elements, and it may include a case where integral parts are connected to each other even if they may be referred to by a different name depending on the position or function, as well as the case of being physically connected or electrically connected.

In the drawings, symbols "x", "y", and "z" representing a direction are used, where "x" is a first direction, "y" is a second direction perpendicular to the first direction, and "z" is a third direction perpendicular to the first direction and the second direction. The first direction x, the second direction y, and the third direction z may correspond to a horizontal direction, a vertical direction, and a thickness direction of the display device, respectively. Unless otherwise specified in the specification, "overlapping" means overlapping in a plan view and overlapping in the third direction z.

FIG. 1 illustrates a top plan view of a display device according to an embodiment. The display device may include a display panel 10, a flexible printed circuit board (FPCB) 20, an integrated circuit chip 30, and a printed circuit board (PCB) 40.

The display panel 10 includes a display area DA and a non-display area NA. The display area DA corresponds to a screen where an image is displayed, and the non-display area NA corresponds to a location where circuits and/or signal lines (for generating and/or transmitting various signals applied to the display area) may be disposed. The non-display area NA may surround the display area DA. In the embodiment of FIG. 1, a boundary between the display area DA and non-display area NA is shown as a rectangular dotted line.

The display area DA includes pixels PX disposed in a predetermined (e.g., matrix) pattern of the display panel 10. The display area DA may also include signal lines. Examples include one or more of a first scan line 121, a second scan line 122, a data line 171, a driving voltage line 172, a common voltage line 173, or an initializing voltage line 174. The first scan line 121 and the second scan line 122 may extend approximately in the first direction x, and the data line 171, driving voltage line 172, common voltage line 173, and initializing voltage line 174 may extend approximately in the second direction y. At least one of the driving voltage line 172, the common voltage line 173, or the initializing voltage line 174 may include at least one voltage line extending approximately in the first direction x and at least one voltage line extending approximately in the second direction y, for example, to form a mesh shape. The first scan line 121, second scan line 122, data line 171, driving voltage line 172, common voltage line 173, and initializing voltage line 174 may be connected to a respective pixel PX. Accordingly, tach pixel PX may receive a first scan signal, a second scan signal, a data voltage, a driving voltage, a common voltage, and a driving voltage from these signal lines. A similar arrangement of lines may be connected to other ones of the pixels PX to receive similar signals. Each of the pixels PX may include, for example, a light emitting element, such as, but not limited to, a light emitting diode (LED).

In one embodiment, the display area DA of the display panel 10 may also include one or more touch electrodes to detect an input from a user (e.g., a contact and/or non-contact touch input from a finger, stylus, or other object).

The non-display area NA of the display panel 10 may include a pad portion PP1, where one or more pads may be disposed to receive signals from an external source relative to the display panel 10. A first end portion of the FPCB 20 may be bonded to the pad portion PP1, and pads of the FPCB 20 may be electrically connected to the one or more pads of the pad portion PP1. In one embodiment, the display panel 10 may include two or more pad portions PP1 spaced from each other along one edge of the display panel 10. In this case, the FPCB 20 may be bonded to the two or more pad portions PP1. In one embodiment, the display panel 10 may include one pad portion PP1 having a predetermined size bonded to one FPCB 20. In another embodiment, multiple pad portions PP1 of the same or different sizes may be bonded to the FPCB 20.

The non-display area NA may also include a driving unit (e.g., a driver or driving logic) that generates and/or processes various signals to drive the display panel 10. Relative to pixel PX, the driving unit may include, for example, a data driver that applies a data signal to the data line 171, a gate driver that applies a gate signal to the first scan line 121 and the second scan line 122, and a signal controller that controls the data driver and the gate driver. Each of the pixels PX may receive a data voltage and/or an initializing voltage at predetermined timing based on a corresponding scan signal generated by the gate driver. In one embodiment, the gate driver may be integrated with the display panel 10 and may be on at least one side of the display area DA.

The data driver may be incorporated, for example, within an integrated circuit chip 30, which, for example, may be mounted on the FPCB 20. Signals output from the integrated circuit chip 30 may be transmitted to the display panel 10 through the pad portion of the FPCB 20 and the pad portion PP1 of the display panel 10. In one embodiment, the display device may include a plurality of integrated circuit chips 30, at least one of which may be disposed on a FPCB 20. In one embodiment, at least one integrated circuit chip 30 may be mounted on the non-display area NA of the display panel 10. In this case, the integrated circuit chip 30 may be between the display area DA and the pad portion PP1.

The signal controller may be embodied, for example, in an integrated circuit chip mounted on a PCB 40. The data driver and the signal controller may also be provided in the same or different integrated chips.

A second end portion of the FPCB 20 (e.g., the end the facing end of the first end portion) may be bonded and electrically connected to a pad portion PP2 of the PCB 40, and may transmit signals between the display panel 10 and the PCB 40. In one embodiment, the PCB 40 may include two or more pad portions PP2 spaced apart from each other along one edge of the display panel 10. In one embodiment, the PCB 40 may include a number of pad portions PP2 corresponding to the number of the FPCBs 20.

The integrated circuit chip 30 may output the signals provided in the display area DA. For example, the integrated circuit chip 30 may output a data voltage, a driving voltage, a common voltage, a initializing voltage, and/or other signals. The non-display area NA may include a data voltage transmitting line, a driving voltage transmitting line, a common voltage transmitting line, and/or an initializing voltage line to transmit the data voltage, driving voltage, common voltage, and initializing voltage (output from integrated circuit chip 30) to respective ones of the data line 171, driving voltage line 172, common voltage line 173, and initializing voltage line 174 of the display area DA. The integrated circuit chip 30 may also output signals to control the gate driver.

The signals output by the integrated circuit chip 30 may be input to the display panel 10 through the pads of the pad portion PP1 connected to the pads in the first end portion of the FPCB 20. The integrated circuit chip 30 may receive signals (e.g., image data and signals related thereto, power, etc.) based on generating the above-described signals through the pads in the second end portion of the FPCB 20, connected to the pads of the pad portion PP2 of PCB 40. A processor, a memory, and/or one or more other features may be disposed in PCB 40. When the display device is applied to a mobile communication terminal, the processor may be an application processor including a central processing unit, a graphics processing unit, a modem, etc. The FPCB 20 may be bent, and PCB 40 may be located on the rear of the display panel 10.

Figure 2:
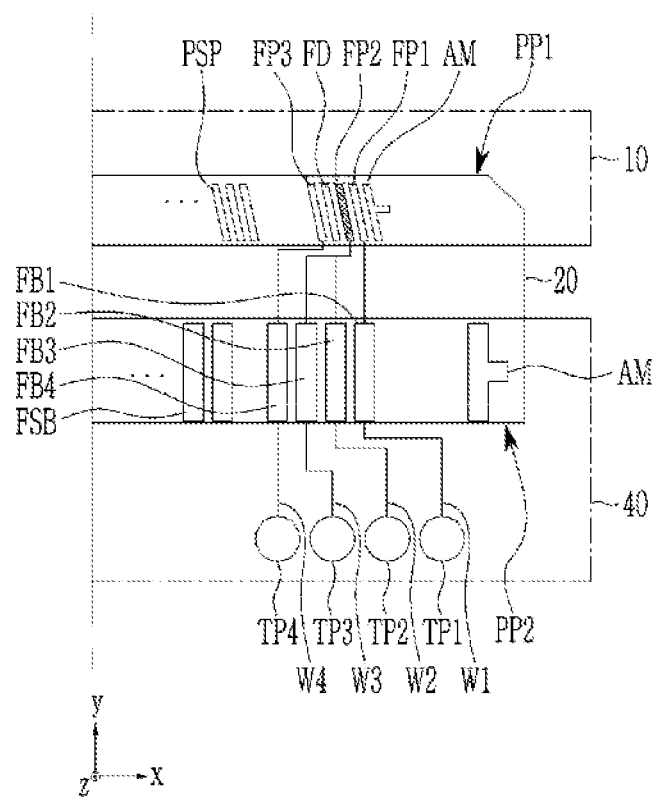
FIG. 2 illustrates an enlarged view of a region R in FIG. 1.
Figure 3:
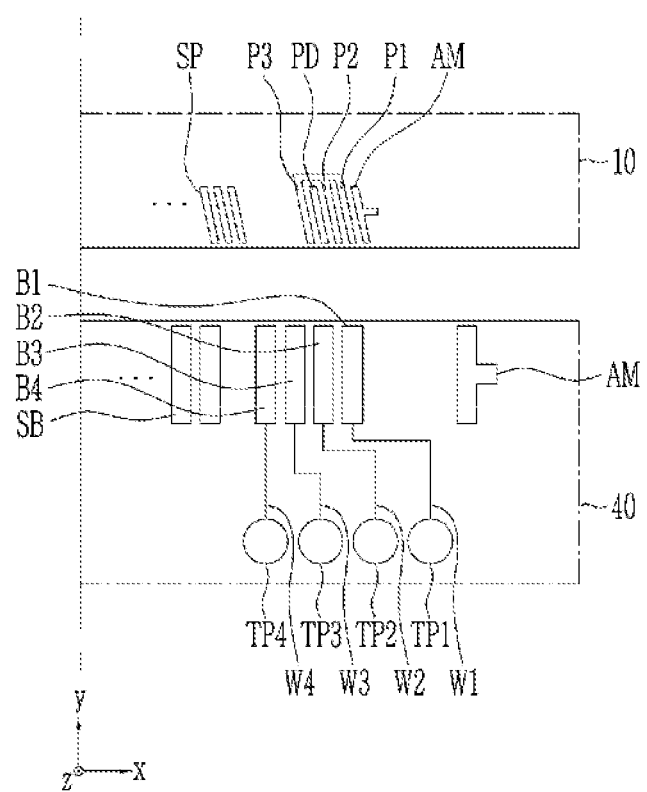
FIG. 3 illustrates an embodiment a flexible printed circuit board in FIG. 2 is removed.
Figure 4:
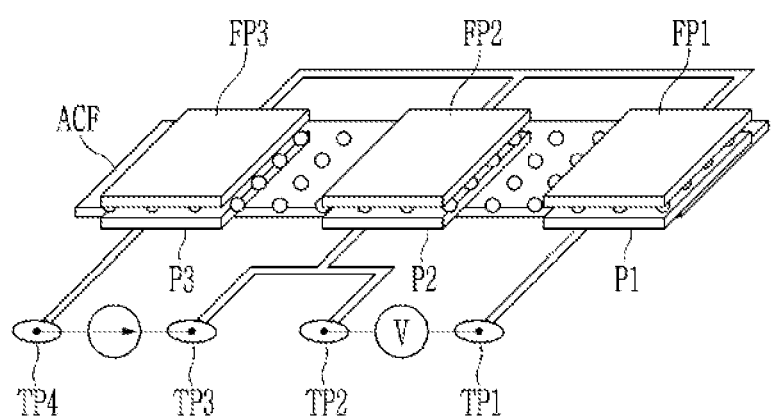
FIG. 4 illustrates an embodiment to measure terminal connection resistances.

FIG. 2 is an enlarged view of a region R region in FIG. 1 in accordance with an embodiment. FIG. 3 is a view showing a state in which FPCB 20 in FIG. 2 has been removed, for explanation purposes, in accordance with an embodiment. FIG. 4 is a schematic view of an arrangement to measure terminal connection resistances according to an embodiment. For example, an example of part of the region where the FPCB 20 is bonded is shown in FIGS. 2 and 3, and an example of pads of the display panel 10 and PCB 40 (which are covered by pads of the FPCB 20) are shown in FIG. 3.

In one embodiment, an anisotropic conductive layer (ACF) (e.g., see FIG. 4) may be used to physically bond and an establish an electrical connection between the FPCB 20 and the display panel 10. For example, bonding of the FPCB 20 may be performed by disposing the anisotropic conductive layer on the pad portion PP1 of the display panel 10 and adhering them together, and pressing the first end portion of the FPCB 20 at the correct position. FPCB 20 may be attached to the display panel 10 by hardening the anisotropic conductive layer, e.g., by applying a predetermined pressure and temperature during compression. For accurate alignment of the FPCB 20, in one embodiment alignment marks AM may be disposed on the display panel 10 and the FPCB 20.

After bonding the first end portion of the FPCB 20 to the pad portion PP1 of the display panel 10, the second end portion of the FPCB 20 may be bonded to the pad portion PP2 of the PCB 40. Bonding FPCB 20 to PCB 40 may also be performed using the anisotropic conductive layer as above, or a different way of bonding may be used in accordance with another embodiment.

After bonding FPCB 20 to display panel 10 and PCB 40, a test may be performed to determine the bonding quality. In one embodiment, bonding quality may correspond to the quality of electrical connection between the pads of the FPCB 20 and the pads of the display panel 10. This electrical connection may be evaluated, for example, by measuring connection resistance between the specific pads. To accomplish this, in one embodiment test pads P1, P2, and P3 may be disposed on the pad portion PP1 of the display panel 10, for example, in the manner shown in FIG. 4.

A first pad group including the test pads may be disposed at one end portion of the pad portion PP1 in a first direction x, and a second pad group including test pads P1, P2, and P3 may be disposed at the other end portion of the pad portion PP2. The test pads P1, P2, and P3 may be electrically connected to each other by extensions of each test pad P1, P2, and P3. At least one dummy pad PD may be disposed between at least two of the test pads P1, P2, and P3, to adjust an interval between the test pads P1, P2, and P3. In one embodiment, the test pads of the first pad group and the test pads P1, P2, and P3 of the second pad group may be symmetric with respect to a predetermined point (e.g., a center) of the pad portion PP1. Signal pads SP (that may receive signals output from the integrated circuit chip 30) may be disposed between the first pad group and the second pad group.

The FPCB 20 may include test pads FP1, FP2, and FP3 connected to the test pads P1, P2, and P3 of the pad portion PP1. The FPCB 20 may include signal pads PSP connected to the signal pads SP of the pad portion PP1. The FPCB 20 may include a dummy pad FD corresponding to the dummy pad DP of the pad portion PP1.

Similar to the pad portion PP1 of the display panel 10, test pads B1, B2, B3, and B4 may be disposed in the pad portion PP2 of the PCB 40. In PCB 40, the test terminals TP1, TP2, TP3, and TP4 may be respectively connected to the test pads B1, B2, B3, and B4 by wirings W1, W2, W3, and W4.

The first pad group including the test pads may be disposed at one end portion of the pad portion PP2 in the first direction x. The second pad group including the test pads B1, B2, B3, and B4 may also be disposed at the other end of the pad portion PP2. In one embodiment, the test pads of the first pad group and test pads B1, B2, B3, and B4 of the second pad group may be symmetric with respect to a predetermined point (e.g., a center) of the pad portion PP2. The signal pads SB for transmitting the signals to the integrated circuit chip 30 may be disposed between the first pad group and the second pad group.

The FPCB 20 may include test pads FB1, FB2, FB3, and FB4 connected to the test pads B1, B2, B3, and B4 of the pad portion PP2. The FPCB 20 may include signal pads FSB connected to the signal pads SB of the pad portion PP2. In the FPCB 20, the test pads FP1, FP2, and FP3 of the first end portion may be electrically connected to the test pads FB1, FB2, FB3, and FB4 of the second end portion by wirings in the FPCB 20. For example, the first test pad FP1 may be connected to the first test pad FB1, the second test pad FP2 may be connected to the second and third test pads FB2 and FB3, and the third test pad FP3 may be connected to the fourth test pad FB4. In one embodiment, among test pads FP1, FP2, and FP3, the first test pad FP1 and the third test pad FP3 (that are disposed on both sides) may be connected to one test pad FB1 and one test pad FB4, and the second test pad FP2 disposed at the center may be connected to two test pads FB2 and FB3. The wirings connected to the second and third test pads FB2 and FB3 may be branched, for example, from wiring connected to the second test pad FP2.

In view of these connections, a connection resistance measurement circuit as shown in FIG. 4 may be formed. In one embodiment, the measured connection resistance may be a connection resistance R between the second test pad P2 of the display panel 10 and the second test pad FP2 of the FPCB 20. To measure the connection resistance R, a current source may be connected to the third and fourth test terminals TP3 and TP4 to apply a current I and a voltage meter may be connected to the first and second test terminals TP1 and TP2 to measure a voltage V. The connection resistance R may be calculated in accordance with the following equation: R=V/I.

If the connection resistance R is measured using 4 terminals in this way, adverse influence on wire resistance may be excluded or reduced compared to a method of measuring a 2-terminal loop resistance. As a result, connection resistance R may be measured more accurately in accordance with the 4-terminal embodiment described herein. If the second test pads P2 of the first and second pad groups at ends of the pad portion PP1 are evaluated to be well connected to the corresponding second test pads PF2 of the FPCB 20, the signal pads SP between the first and second pad groups may also be evaluated as being well connected to the signal pads SB.

To perform a 4-terminal measurement, a power supply (e.g., the current source I) and a measurement device (e.g., the voltage meter) may be connected to four test terminals TP1, TP2, TP3, and TP4. When a plurality of FPCBs 20 are bonded to the display panel 10 and the PCB 40, test terminals of eight times the number of the FPCBs 20 may be used to test the bonding quality of each FPCB 20. For example, when n FPCBs are bonded, n×8 test terminals may be used. To dispose a plurality of test terminals on the PCB 40, considerable space may be used. This may place restrictions on the design and disposition of the test pads, and down-sizing of PCB 40 may be difficult. In addition, when the power device and measurement device are connected to a plurality of test terminals, it may be difficult to connect the devices and obtaining a measurement may take a lot of time.

Figure 5:
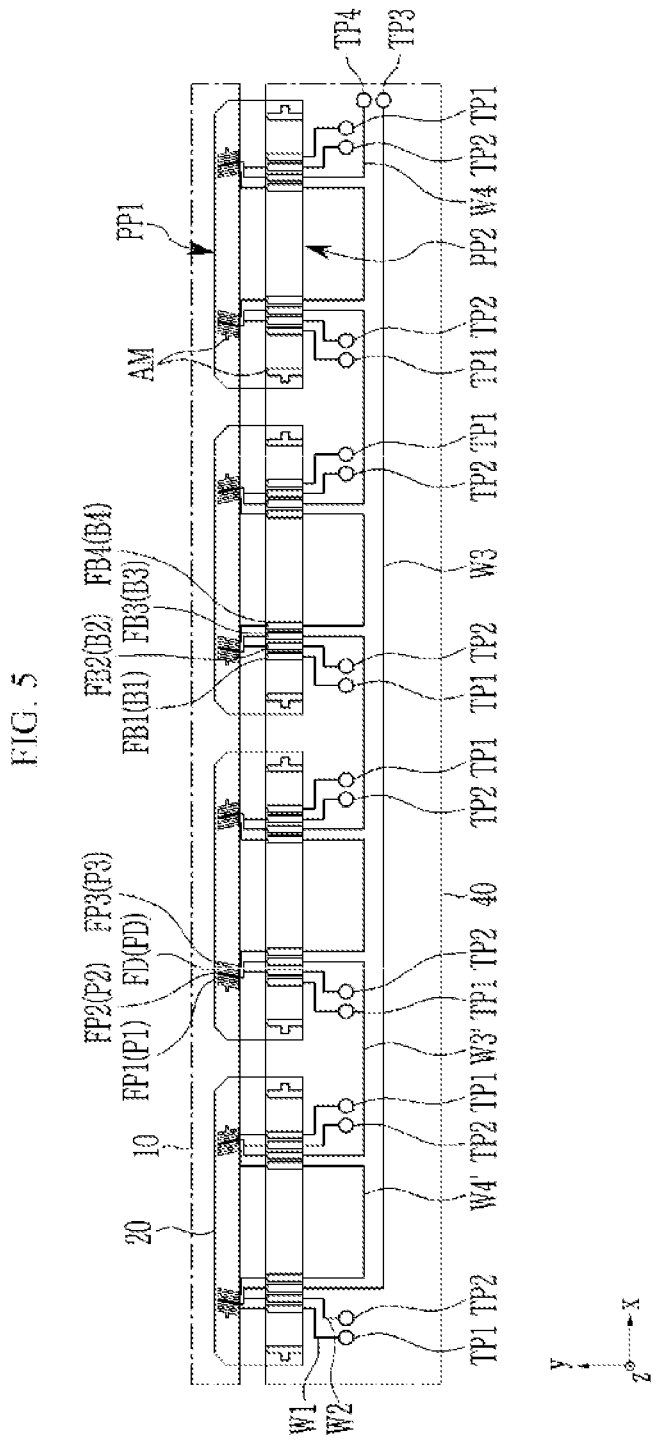
FIG. 5 illustrates an embodiment where a display panel, a printed circuit board, and a flexible printed circuit board are bonded in a display device.

FIG. 5 is a schematic view showing bonding a display panel, a CB, and a FPCB in a display device according to an embodiment. In FIG. 5, the display device includes four FPCBs 20 bonded to the display panel 10 and PCB 40. To more clearly indicate characteristics of the embodiment, display panel 10 is shown only in the vicinity of the pad portion PP1, without the integrated circuit chip 30 and the signal pads SP, FSP, SB, and FSB.

Referring to FIG. 5, in each FPCB 20, the first end portion is bonded to the pad portion PP1 of the display panel 10, and the second end portion is bonded to the pad portion PP2 of the PCB 40. Referring to FIGS. 2 and 3, the first pad group and the second pad group (including test pads P1, P2, and P3) may be disposed at ends of each pad portion PP1 in the first direction x. The test pads P1, P2, and P3 of the first pad group and the test pads P1, P2, and P3 of the second pad group may be symmetric with respect to a predetermined point (e.g., a center) of the pad portion PP1. The first pad group and the second pad group (including the test pads B1, B2, B3, and B4) may be at ends of each pad portion PP2 in the first direction x. The test pads B1, B2, B3, and B4 of the first pad group and the test pads B1, B2, B3, and B4 of the second pad group may be symmetric with respect to a predetermined point (e.g., a center) of the pad portion PP2.

In the FPCB 20, the test pads FP1, FP2, and FP3 connected to the test pads P1, P2, and P3 of the pad portion PP1 may be included in the first end portion. The test pads FB1, FB2, FB3, and FB4 connected to the test pads B1, B2, B3, and B4 of the pad portion PP2 may be included in the other end. The first test pad FP1 may be connected to the first test pad FB1, the second test pad FP2 may be connected to the second and third test pads FB2 and FB3, and the third test pad FP3 may be connected to the fourth test pad FB4.

In the PCB 40, in each pad group, the first test pad B1 may be connected to the first test terminal TP1 by wiring W1, and the second test pad B2 may be connected to the second test terminal TP2 by wiring W2. In each pad group, the third test pad B3 may be connected to the third test pad B3 of the adjacent pad group by the wiring W3', may be connected to the third test terminal TP3 by wiring W3, or may be connected to the fourth test terminal TP4 by wiring W4. In each pad group, the fourth test pad B4 may be connected to the fourth test pad B4 of the adjacent pad group by wiring W4'.

In the illustrated embodiment, the third test pad B3 of the pad group at the leftmost side is connected to the third test terminal TP3, the third test pad B3 of the pad group at the rightmost side is connected to the fourth test terminal TP4, and the remaining third test pads B3 are connected to the third test pad B3 of the pad group connected to another FPCB 20.

In this way, when the test pads B1, B2, B3, and B4 of the PCB 40 are connected, wire resistance may be reduced or minimized. Also, current may be applied to the PCBs 40 using two test terminals TP3 and TP4. Since the third and fourth test terminals TP3 and TP4 are not to be disposed for the third and fourth test pads B3 and B4 of each pad group, the size of the PCB 40 may be reduced and design freedom may be increased. In addition, since the power supply may be connected only once to measure the resistance of the several FPCBs 20, measurement time may be significantly shortened.

In the shown embodiment, the third and fourth test terminals TP3 and TP4 are disposed at the right of the PCB 40. In another embodiment, the third and fourth test terminals TP3 and TP4 may be disposed at other locations, e.g., the left side or center of the PCB 40. Also, the third and fourth test terminals TP3 and TP4 may be provided to one of wirings W4' connecting the third test pad B3 of the pad group of the leftmost side and the third test pad B3 of the pad group of the rightmost side and/or connecting adjacent fourth test patterns B4.

Figure 6:
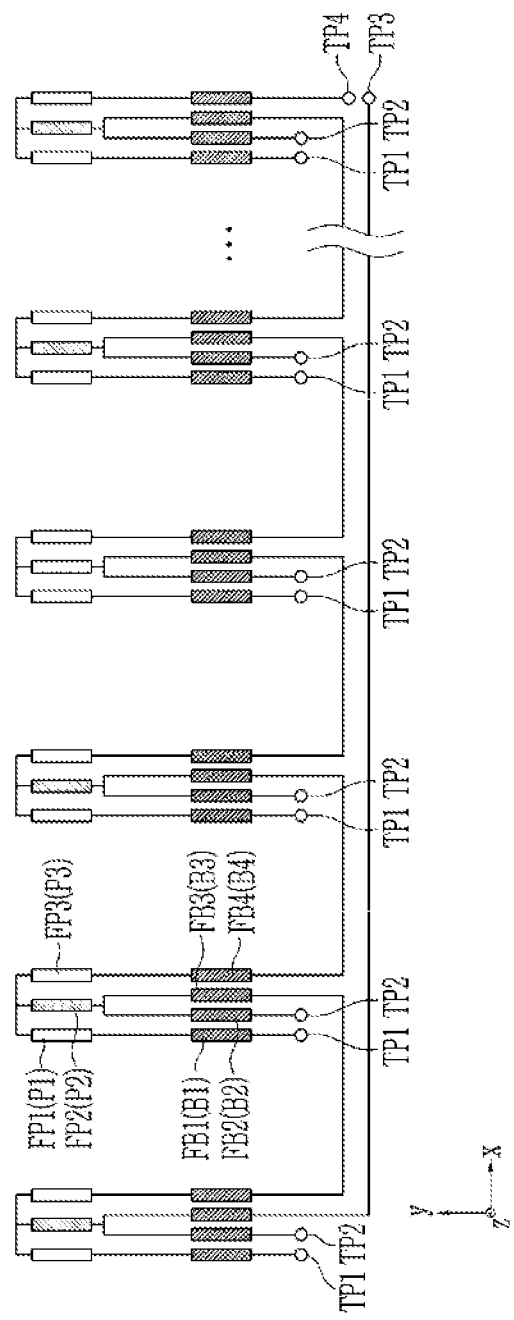
FIG. 6 illustrates an embodiment to measure connection resistance in a display device to which one or more flexible printed circuit boards are bonded.
Figure 7:
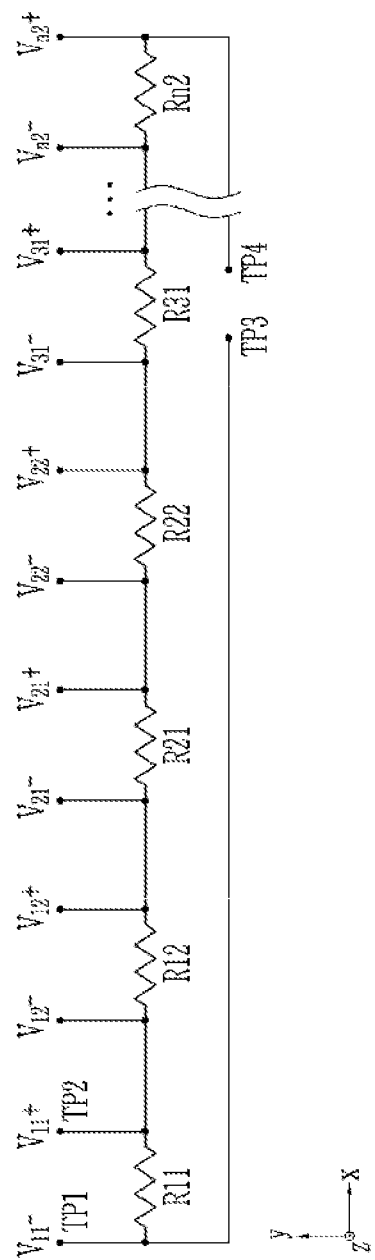
FIG. 7 illustrates an equivalent circuit diagram corresponding to FIG. 6.

FIG. 6 is a connection diagram illustrating an embodiment to measure connection resistance in a display device to which n FPCBs are bonded, and FIG. 7 is an example of an equivalent circuit diagram of the connection diagram shown in FIG. 6.

When the n FPCBs 20 are bonded, if the test pad patterns are connected as shown in FIG. 5, the test pad patterns for measuring connection resistance between the second test pad P2 of the display panel 10 and the second test pad FP2 of the FPCB 20 may be connected as shown in FIG. 6. The connection resistances between the second test pads P2 and FP2 may be represented by R11, R12, . . . , Rn2 as shown in the circuit diagram of FIG. 7. The connection resistances R11, R12, . . . , Rn2 may be calculated, for example, by connecting the current source to the third and fourth test terminals TP3 and TP4 to apply current I and by connecting the voltage meter to the first and second test terminals TP1 and TP2 to measure the voltage. Since a single current source may be used by serializing the connection of the current source, and only one third test terminal TP3 and one fourth test terminal TP4 may be used, the number of test terminals TP1, TP2, TP3, and TP4 may be reduced.

Figure 8:
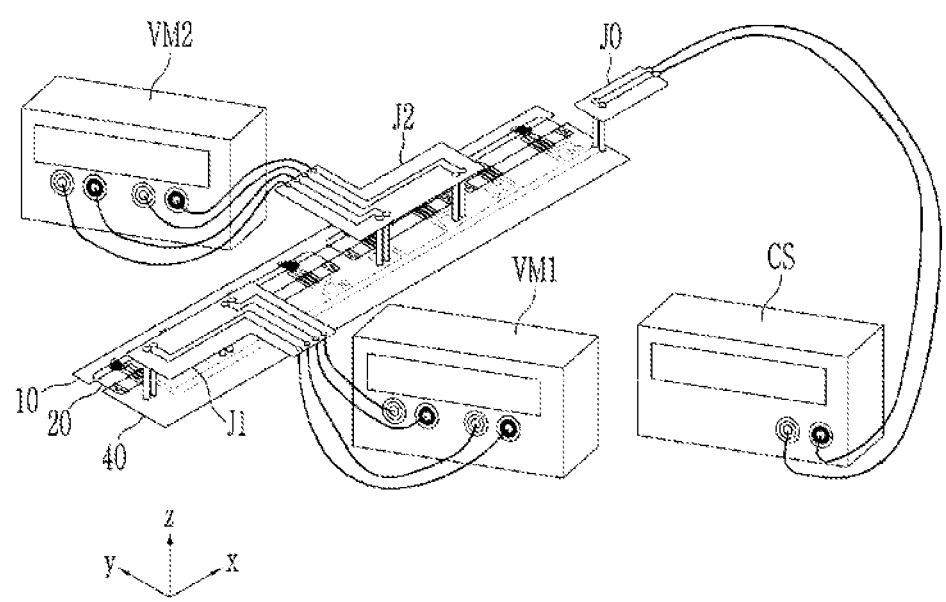
FIG. 8 illustrates a embodiment to measure connection resistance in a display device.

FIG. 8 is a measurement schematic view of an arrangement to measure connection resistance in a display device according to an embodiment. In FIG. 8, an example is shown for measuring the connection resistance in a display device in which four FPCBs 20 are bonded as shown in FIG. 5 using one one-channel current source CS and two two-channel voltage meters VM1 and VM2.

Referring to FIGS. 5 and 8, two terminals of a connection jig J0 of the current source CS are connected to respective test terminals TP3 and TP4 disposed at the right side of the PCB 40. Two terminals of a connection jig J1 of the voltage meter VM1 are aligned and connected to four test terminals TP1 and TP2 disposed corresponding to both sides of the first FPCB 20 at the left, and two terminals of a connection jig J2 of the voltage meter VM2 are aligned and connected to four test terminals TP1 and TP2 corresponding to both sides of the third FPCB 20 at the left. In this connected state, the current source CS may apply the current and voltage of the voltage meters VM1 and VM2 may be measured to simultaneously measure connection resistances of four positions of two FPCBs 20.

Next, connection jig J1 may be moved to four test terminals TP1 and TP2 corresponding to both sides of the second FPCB 20 from the left and then two terminals of the connection jig J1 are aligned and connected. Also, the connection jig J2 is moved to four test terminals TP1 and TP2 corresponding to both sides of the fourth FPCB 20 from the left and then two terminals of the connection jig J2 are aligned and connected. In this connected state, connection resistances of four positions of two FPCBs 20 may be simultaneously measured as the current source CS applies the current and voltage is measured by the voltage meters VM1 and VM2.

In this way, it is possible to measure the connection resistances of the FPCBs 20 in two steps while one current source CS is connected to the test terminals TP3 and TP4. The measurement method of the connection resistance may be changed in various ways. For example, for the display device as illustrated, the connection resistances can be measured using one two-channel voltage meter and moving the jig three times. Also, by considering the size of the FPCB 20 and/or PCB 40, the measurement equipment, etc., the measurement method may be changed in various ways. In measuring connection resistance to evaluate bonding quality of a plurality of FPCBs 20, the connection resistance of a plurality of points may be measured, simultaneously or continuously, when one current source CS is connected to two test terminals TP3 and TP4.

FIGS. 9 to 12 are schematic views showing embodiments of bonding a display panel, a PCB, and a FPCB in a display device.

Figure 9:
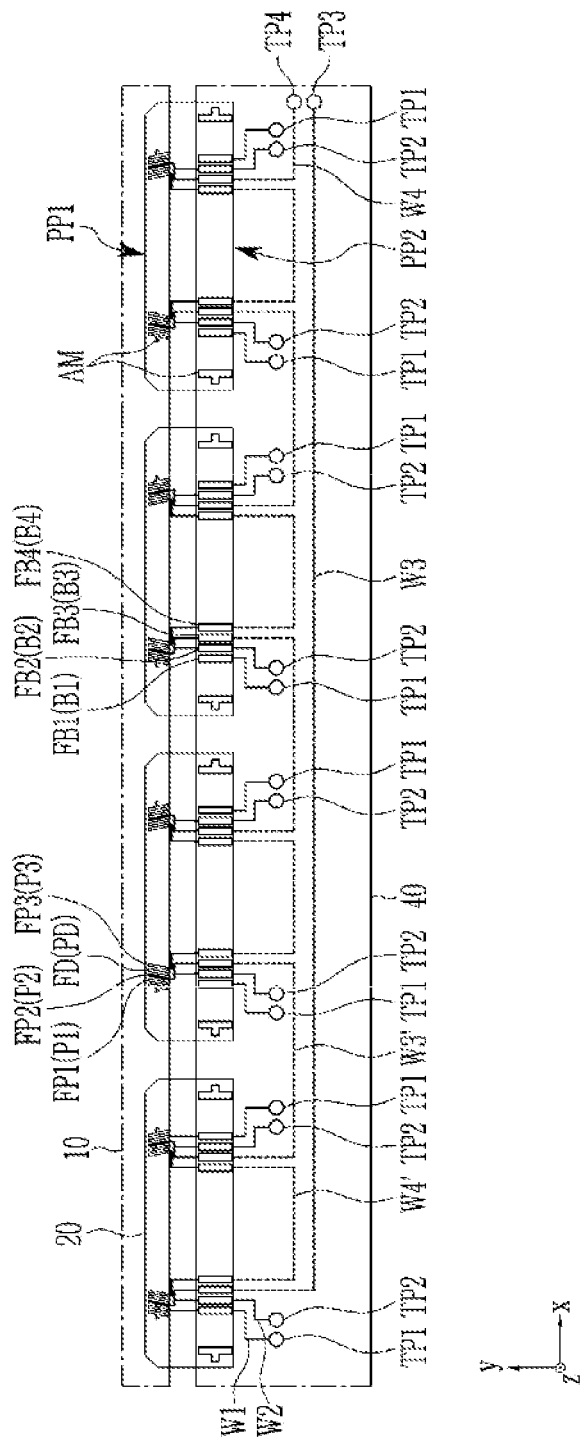
FIGS. 9 to 12 illustrate embodiments of bonding a display panel, printed circuit board, and flexible printed circuit board of a display device.

Referring to FIG. 9, the third and fourth test terminals TP3 and TP4 for connecting the current source are disposed on the back of the PCB 40. The first and second test terminals TP1 and TP2 for connecting the voltage meter are disposed on the front side of the PCB 40 (e.g., the surface on which the pad portion PP2 is positioned) as in the above-described embodiment. When the third and fourth test terminals TP3 and TP4 are disposed on the back of the PCB 40, the degree of freedom of the wirings in front of the PCB 40 may be increased. If PCB 40 is a multi-layered PCB 40, one or more of the wirings W1, W2, W3, or W4 may be disposed inside the PCB 40 without being externally exposed.

Figure 10:
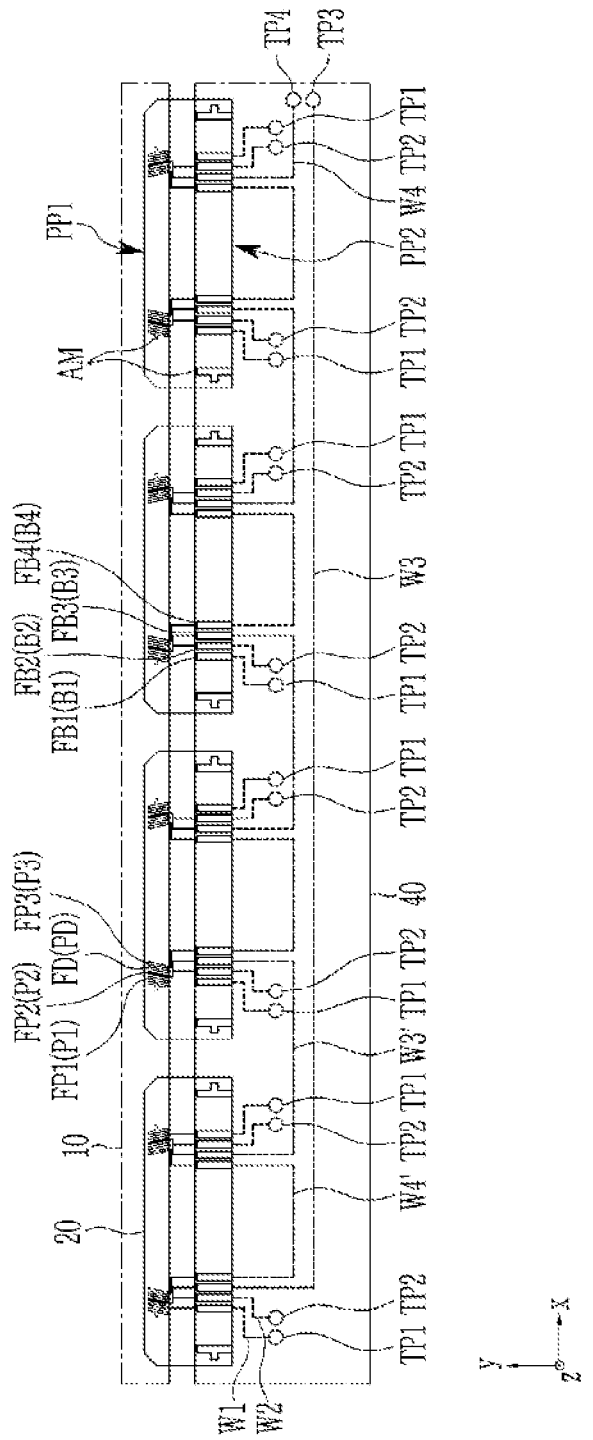

Referring to FIG. 10, the first and second test terminals TP1 and TP2 and the third and fourth test terminals TP3 and TP4 are disposed on the back of the PCB 40. Since the test terminals TP1, TP2, TP3, and TP4 are not disposed in front of the PCB 40, design freedom of the PCB 40 may be increased.

Figure 11:
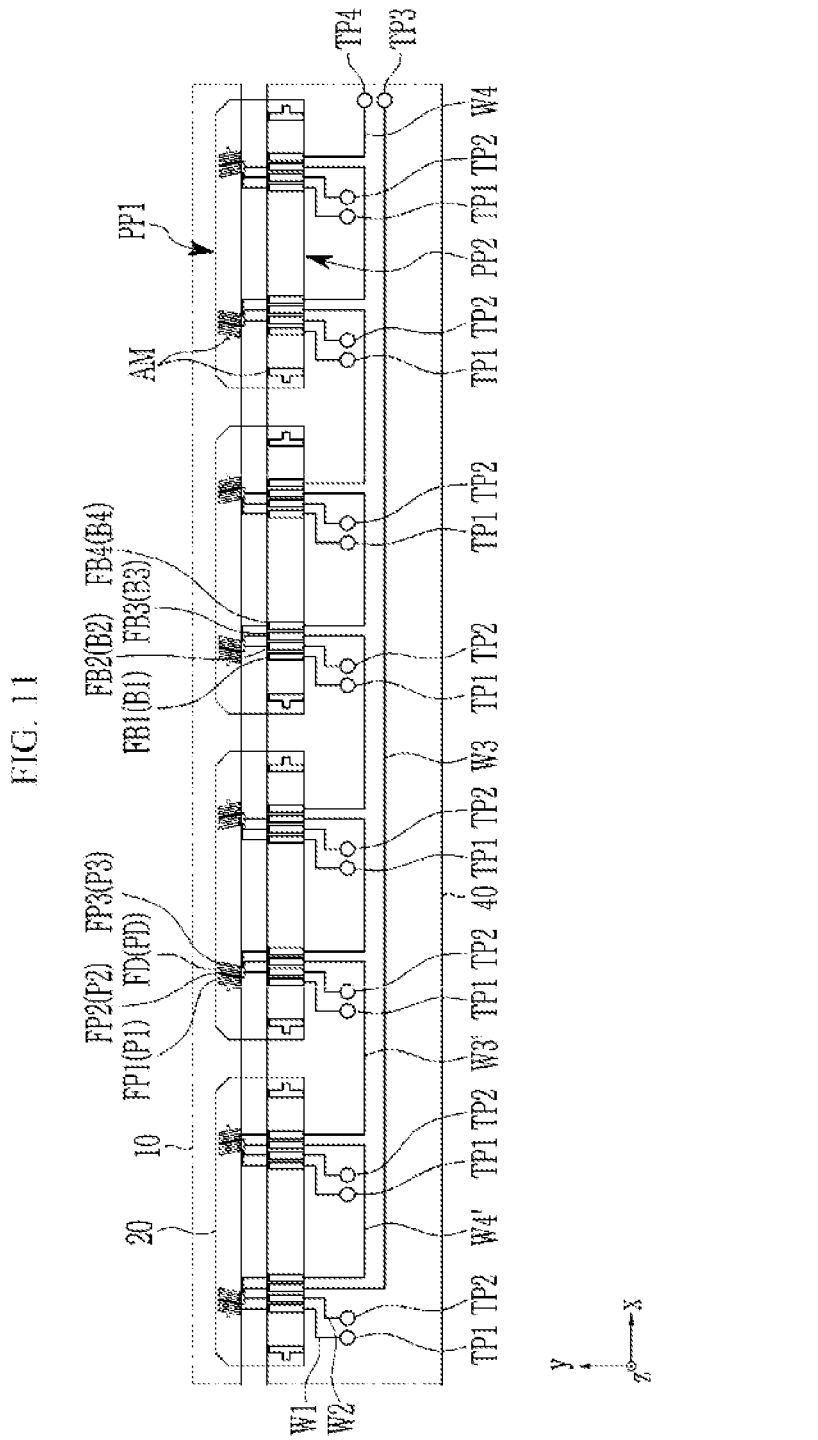

Referring to FIG. 11, both the first pad group and the second pad group may be disposed to one side (e.g., the left) of wirings W3' and W4' to which the first and second test terminals TP1 and TP2 are adjacent. In one embodiment, both the first pad group and the second pad group may be disposed at another side (e.g., right) of the wirings W3' and W4' to which the first and second test terminals TP1 and TP2 are adjacent. The positions of the first and second test terminals TP1 and TP2 may be changed in various ways. In addition, the position or arrangement of the test terminals TP1, TP2, TP3, and TP4 may be designed to enable the connection without changing the measurement equipment.

Figure 12:
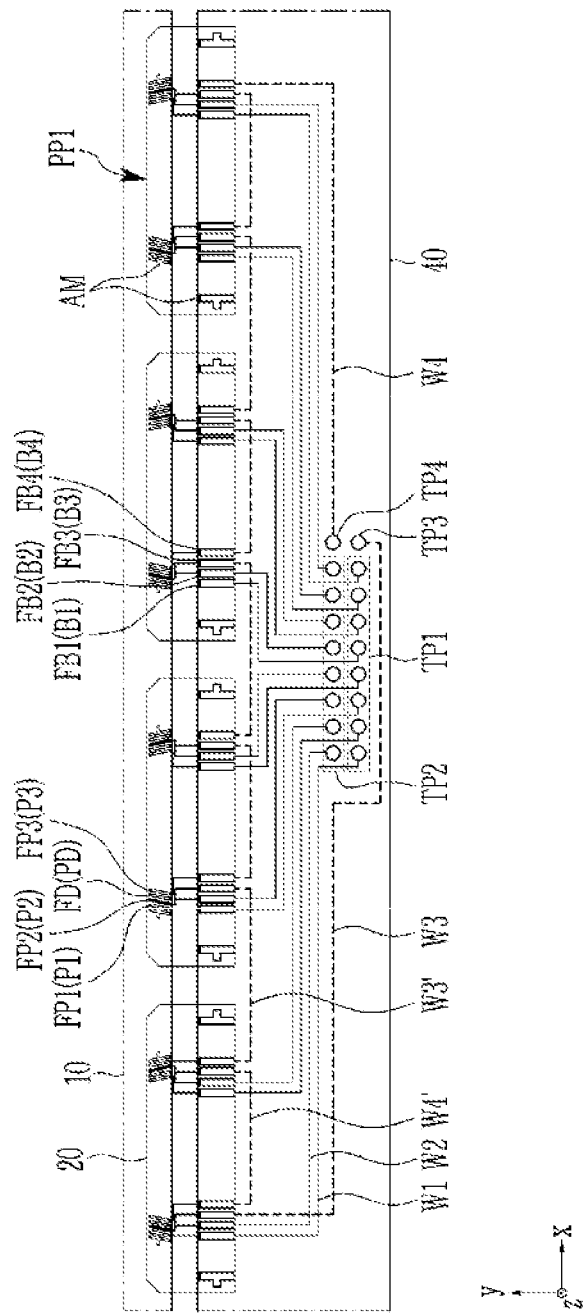

Referring to FIG. 12, test terminals TP1, TP2, PT3, and TP4 may be adjacent to each other in a predetermined area of the PCB 40. Although the test terminals TP1, TP2, PT3, and TP4 are shown to be positioned on a central portion of the PCB 40 in the first direction x, they may be disposed at another location (e.g., right or left side) of the PCB 40. In one embodiment, the test terminals TP1, TP2, PT3, and TP4 may be disposed in two or more columns, for example, in the first direction x. The first test terminals TP1 and the second test terminals TP2 may be disposed in different rows, and the first test terminals TP1 and the second test terminals TP2 in each row may be mixed (e.g., alternately). The first test terminal TP1 and the second test terminal T2 of each pad group may be aligned in the second direction y. The third test terminal TP3 and the fourth test terminal TP4 may be on one side of the first and second test terminals T1 and T2. The width of the region where the test terminals TP1, TP2, PT3, and TP4 are disposed may be approximately less than the width of one or two FPCBs 20. The spacing between test terminals TP1, TP2, PT3, and TP4 may be less than the width of one or two test terminals. When the test terminals TP1, TP2, PT3, and TP4 are adjacent to each other, it may be easier to connect the terminals of the measurement device.

Figure 13:
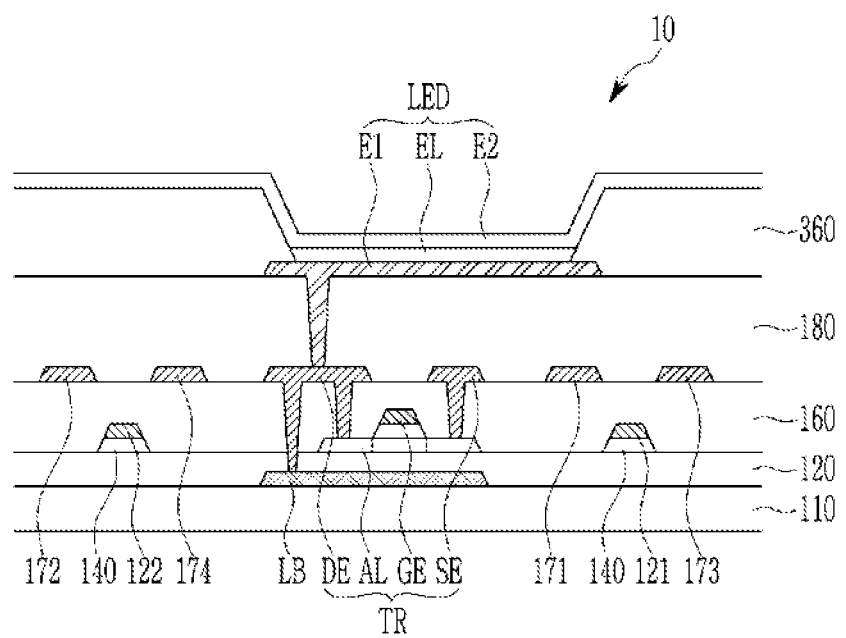
FIG. 13 illustrates an embodiment of a portion of a display area in a display device.

FIG. 13 is a schematic cross-sectional view of an embodiment of a portion (e.g., a pixel) of a display area in a display device, for example, as described herein. Referring to FIG. 13, the display panel 10 of a display device includes a substrate 110 with several layers, elements, and wirings formed thereon. The substrate 110 may include an insulating material such as glass or plastic.

A light blocking layer LB may be disposed on the substrate 110 to block external light from reaching the semiconductor layer AL of transistor TR and therefore to prevent characteristic deterioration of the semiconductor layer AL. The light blocking layer LB may function, for example, as an electrode to which a specific voltage is applied from the display panel 10. In this case, a current change rate in a saturation region of a voltage-current characteristic graph of the transistor TR may decrease. The light blocking layer LB may include various materials, including but not limited to copper (Cu), aluminum (Al), silver (Ag), chromium (Cr), titanium (Ti), tantalum (Ta), and the like, and may be a single layer or may include multiple layers.

A barrier layer may be disposed between the substrate 110 and the light blocking layer LB. The barrier layer may include, for example, one or more inorganic insulating materials such as a silicon nitride ($SiN_x$), a silicon oxide ($SiO_x$), and a silicon oxynitride ($SiO_xN_y$). The barrier layer may be a single layer or may include multiple layers.

A buffer layer 120 may be disposed on the light blocking layer LB to block impurities that may diffuse from the substrate 110 to the semiconductor layer AL during the process of forming the semiconductor layer AL. The buffer layer 120 may also reduce stress applied to the substrate 110. The buffer layer 120 may include, for example, an inorganic insulating material such as silicon nitride ($SiN_x$), silicon oxide ($SiO_x$), or a silicon oxynitride ($SiO_xN_y$), and may be a single layer or may include multiple layers.

A semiconductor layer AL may be disposed on the buffer layer 120 and may include a channel region of the transistor TR, along with source and drain regions on respective sides thereof. The semiconductor layer AL may include, for example, amorphous silicon, polycrystalline silicon, or an oxide semiconductor. In one embodiment, the semiconductor layer AL may include a low temperature polysilicon (LTPS) or an oxide semiconductor material containing at least one of zinc (Zn), indium (In), gallium (Ga), or tin (Sn). In one embodiment, the semiconductor layer may include IGZO (indium-gallium-zinc oxide).

A gate insulating layer 140 may be disposed on the semiconductor layer AL and may include an inorganic insulating material (e.g., silicon nitride ($SiN_x$), silicon oxide ($SiO_x$), silicon oxynitride ($SiO_xN_y$)) and may be a single layer or may include multiple layers.

A gate conductive layer may include a gate electrode GE of the transistor TR, a first scan line 121, a second scan line 122, etc., and may be disposed on the gate insulating layer 140. The gate conductive layer may include, for example, molybdenum (Mo), aluminum (Al), copper (Cu), titanium (Ti), or another material, and may be a single layer or may include multiple layers.

An interlayer insulating layer 160 may be disposed on the gate conductive layer and may include an inorganic insulating material (e.g., silicon nitride ($SiN_x$), silicon oxide ($SiO_x$), silicon oxynitride ($SiO_xN_y$)), and may be a single layer or may include multiple layers.

A data conductive layer may be disposed on the interlayer insulating layer 160 and may include a source electrode SE and a drain electrode DE of the transistor TR, a data line 171, a driving voltage line 172, a common voltage line 173, an initializing voltage line 174, and other features. The drain electrode DE may be connected to the light blocking layer LB through a contact hole formed in the interlayer insulating layer 160 and the buffer layer 120. The data conductive layer may include, for example, aluminum (Al), platinum (Pt), palladium (Pd), silver (Ag), magnesium (Mg), gold (Au), nickel (Ni), neodymium Nd, iridium (Ir), chromium (Cr), nickel (Ni), calcium (Ca), molybdenum (Mo), titanium (Ti), tungsten (W), copper (Cu), or another conductive material. The data conductive layer may be a single layer or may include multiple layers.

A planarization layer 180 may be disposed on the data conductive layer and, for example, may be an organic layer. In one embodiment, the planarization layer 180 may include an organic insulating material. Examples include a general purpose polymer (e.g., poly(methyl methacrylate) or polystyrene), a polymer derivative having a phenolic group, an acryl-based polymer, an imide polymer, a polyimide, an acryl-based polymer, and a siloxane-based polymer.

A passivation layer may be disposed between the data conductive layer and the planarization layer 180, and may include one or more inorganic insulating materials, e.g., silicon nitride ($SiN_x$), a silicon oxide ($SiO_x$), silicon oxynitride ($SiO_xN_y$), or another material.

A pixel electrode E1 of the light emitting diode LED may be disposed on the planarization layer 180, and may be connected to the drain electrode DE through a contact hole formed in the planarization layer 180. The pixel electrode E1 may be formed, for example, of a reflective conductive material, a semi-transmissive conductive material, or a transparent conductive material. The pixel electrode E1 may contain a transparent conductive material. Examples include indium tin oxide (ITO) or indium zinc oxide (IZO). In one embodiment, the pixel electrode E1 may include a metal or metal alloy. Examples include lithium (Li), calcium (Ca), aluminum (Al), silver (Ag), magnesium (Mg), and gold (Au).

A pixel definition layer 360 having an opening overlapping the pixel electrode E1 may be disposed on the planarization layer 180. The pixel definition layer 360 may include an organic insulating material, e.g., an acryl-based polymer or an imide-based polymer.

An emission layer EL may be disposed on the pixel electrode E1. In addition to the emission layer EL, at least one of a hole injection layer, a hole transport layer, an electron transport layer, or an electron injection layer may be disposed on the pixel electrode E1.

A common electrode E2 may be disposed on the emission layer EL and, in one embodiment, may be disposed over one or more pixels. The common electrode E2 may be may have a light transmissive characteristic and, for example, may include a thin layer of a metal having a low work function such as calcium (Ca), barium (Ba), magnesium (Mg), aluminum (Al), and silver (Ag). In one embodiment, the common electrode E2 may include a transparent conductive oxide such as indium tin oxide (ITO) or indium zinc oxide (IZO).

The pixel electrode E1, emission layer EL, and common electrode E2 of each pixel PX form a light emitting diode LED such as an organic light emitting diode. The pixel electrode E1 may be an anode of the light emitting diode (LED), and the common electrode E2 may be a cathode of the light emitting diode (LED).

An encapsulation layer may be disposed on the common electrode E2 and, for example, may be a glass substrate bonded to the substrate 110 by a sealant. The encapsulation layer may be a thin film encapsulation layer including, for example, a stacked arrangement of at least one inorganic layer and at least one organic layer.

While the inventive concept has been described in connection with what is presently considered to be practical embodiments, it is to be understood that the inventive concept is not limited to the disclosed embodiments. On the contrary, it is intended to cover various modifications and equivalent arrangements included within the spirit and scope of the appended claims. The embodiments may be combined to form additional embodiments.

What is claimed is:

1. A display device, comprising:
a display panel including a first pad portion;
a printed circuit board (PCB) including a second pad portion; and
a flexible printed circuit board (FPCB) including a first end portion and a second end portion, the first end portion connected to the first pad portion and the second end portion connected to the second pad portion, wherein the second pad portion includes a first pad group and a second pad group each including a plurality of test pads, and wherein one test pad of the first pad group is connected to one test pad of the second pad group.

2. The display device of claim 1, wherein
the first pad group includes first to fourth test pads sequentially disposed from a first end of the second pad portion,
the second pad group includes first to fourth test pads sequentially disposed from a second end of the second pad portion opposite the first end, and
the fourth test pad of the first pad group is connected to the fourth test pad of the second pad group.

3. The display device of claim 2, wherein the first test pad and the second test pad of the first pad group are respectively connected to the first test terminal and the second test terminal of the PCB.

4. The display device of claim 2, wherein:
the display panel includes a third pad portion,
the PCB includes a fourth pad portion,
the display device includes a flexible printed circuit board including a first end portion connected to the third pad portion and a second end portion connected to the fourth pad portion, wherein:
the fourth pad portion includes a first pad group and a second pad group each including first to fourth test pads, and
the third test pad of the second pad group of the second pad portion is connected to the third test pad of the first pad group of the fourth pad portion.

5. The display device of claim 4, wherein the third test pad of the first pad group of the second pad portion is connected to the third test terminal of the PCB.

6. The display device of claim 4, wherein:
the first and second test terminals are on a first surface of the PCB, and
the third test terminal is on a second surface of the PCB opposite to the first surface.

7. The display device of claim 4, wherein the third test pad of the second group of the fourth pad portion is connected to the fourth test terminal of the PCB.

8. The display device of claim 2, wherein:
the FPCB includes first to third test pads in the first end portion and includes first to fourth test pads in the second end portion and respectively connected to the first to fourth test pads of the first or second pad group, and
one of the first to third test pads in the first end portion is connected to the second and third test pads in the second end portion.

9. The display device of claim 8, wherein:
the first to third test pads in the first end portion are sequentially disposed from one end of the FPCB,
the second test pad in the first end portion is connected to the second and third test pads in the second end portion,
the first pad portion includes first to third test pads respectively connected to the first to third test pads in the first end portion of the FPCB, and
the first to third test pads are connected to each other.

10. The display device of claim 1, wherein:
the display panel includes a third pad portion,
the PCB includes a fourth pad portion,
the display device includes a flexible printed circuit board including a first end portion connected to the third pad portion and a second end portion connected to the fourth pad portion, wherein:
the fourth pad portion includes a first pad group and a second pad group each including a plurality of test pads,
one test pad of the second group of the second pad portion is connected to one test pad of the first group of the fourth pad portion,
each pad group of the second and fourth pad portions includes at least one test pad individually connected to a plurality of test terminals of the PCB, and
the plurality of test terminals are adjacent to each other.

11. A display device, comprising:
a display panel including a first pad portion and a second pad portion;
a printed circuit board (PCB) including a third pad portion and a fourth pad portion;
a first flexible printed circuit board (FPCB) including a first end portion connected to the first pad portion and a second end portion connected to the third pad portion; and
a second flexible printed circuit board including a first end portion connected to the second pad portion and a second end portion connected to the fourth pad portion, wherein:
the third pad portion includes a first pad group and a second pad group each including a plurality of test pads,
the fourth pad portion includes a first pad group and a second pad group each including a plurality of test pads, and
one test pad of the second pad group of the third pad portion is connected to one test pad of the first pad group of the fourth pad portion.

12. The display device of claim 11, wherein:
one test pad of the first pad group and one test pad of the second pad group are connected in the third pad portion, and
one test pad of the first pad group and one test pad of the second pad group are connected in the fourth pad portion.

13. The display device of claim 12, wherein:
the first pad group includes first to fourth test pads sequentially disposed from a first end of each of the third and fourth pad portions,
the second pad group includes first to fourth test pads sequentially disposed from a second end of each of the third and fourth pad portions, and
in each of the third and fourth pad portions, the fourth test pad of the first pad group is connected to the fourth test pad of the second pad group.

14. The display device of claim 13, wherein the first test pad and the second test pad of the first pad group are respectively connected to the first test terminal and the second test terminal of the PCB.

15. The display device of claim 13, wherein the third test pad of the second pad group of the third pad portion is connected to the third test pad of the first pad group of the fourth pad portion.

16. The display device of claim 13, wherein the third test pad of the first pad group of the third pad portion is connected to the third test terminal of the PCB.

17. The display device of claim 16, wherein:
the first and second test terminals are on a first surface of the PCB, and
the third test terminal is on a second surface of the PCB opposite to the first surface.

18. The display device of claim 13, wherein the third test pad of the second group of the fourth pad portion is connected to the fourth test terminal of the PCB.

19. The display device of claim 13, wherein:
the first FPCB includes first to third test pads sequentially disposed in the first end portion and includes first to fourth test pads disposed in the second end portion and respectively connected to the first to fourth test pads of the first or second pad group of the third pad portion, and
the second test pad in the first end portion is connected to the second and third test pads in the second end portion.

20. The display device of claim 19, wherein:
the first pad portion includes first to third test pads respectively connected to the first to third test pads in the first end portion of the first FPCB, and
the first to third test pads are connected to each other.

* * * * *